United States Patent [19]

Krauss

[11] 4,320,447

[45] Mar. 16, 1982

[54] FAIL-SAFE AMPLIFIER POWER SUPPLY

[76] Inventor: Geoffrey H. Krauss, 16 Riviera Dr., Latham, N.Y. 12110

[21] Appl. No.: 205,995

[22] Filed: Nov. 12, 1980

[51] Int. Cl.³ .............................................. H02M 3/02
[52] U.S. Cl. ...................................... 363/63; 323/267
[58] Field of Search .................................. 363/59–61, 363/63; 323/267; 307/43, 72, 127, 236; 361/245, 246

[56] References Cited

U.S. PATENT DOCUMENTS

| | | | |
|---|---|---|---|
| 3,133,242 | 5/1964 | Harries | 323/267 |
| 3,747,008 | 7/1973 | Zaretsky | 323/267 |
| 3,826,969 | 7/1974 | Eichelberger et al. | 323/267 |
| 3,944,908 | 3/1976 | Oki | 363/63 |

Primary Examiner—William M. Shoop
Assistant Examiner—Peter S. Wong

[57] ABSTRACT

A fail-safe power supply for providing operating potential to a first, e.g. drain, electrode of a device, such as a gallium-arsenide field effect transistor (GaAsFET) and the like, only if operating potential, of an opposite polarity, is previously applied to another, e.g. gate, electrode of the device. A DC-to-DC converter is powered by the gate electrode potential to provide drain electrode potential only when gate electrode is present. Both the gate and drain potentials may be electronically regulated. The DC-to-DC converter and the dual regulators may be fully integratable into a single four-lead integrated circuit.

13 Claims, 4 Drawing Figures

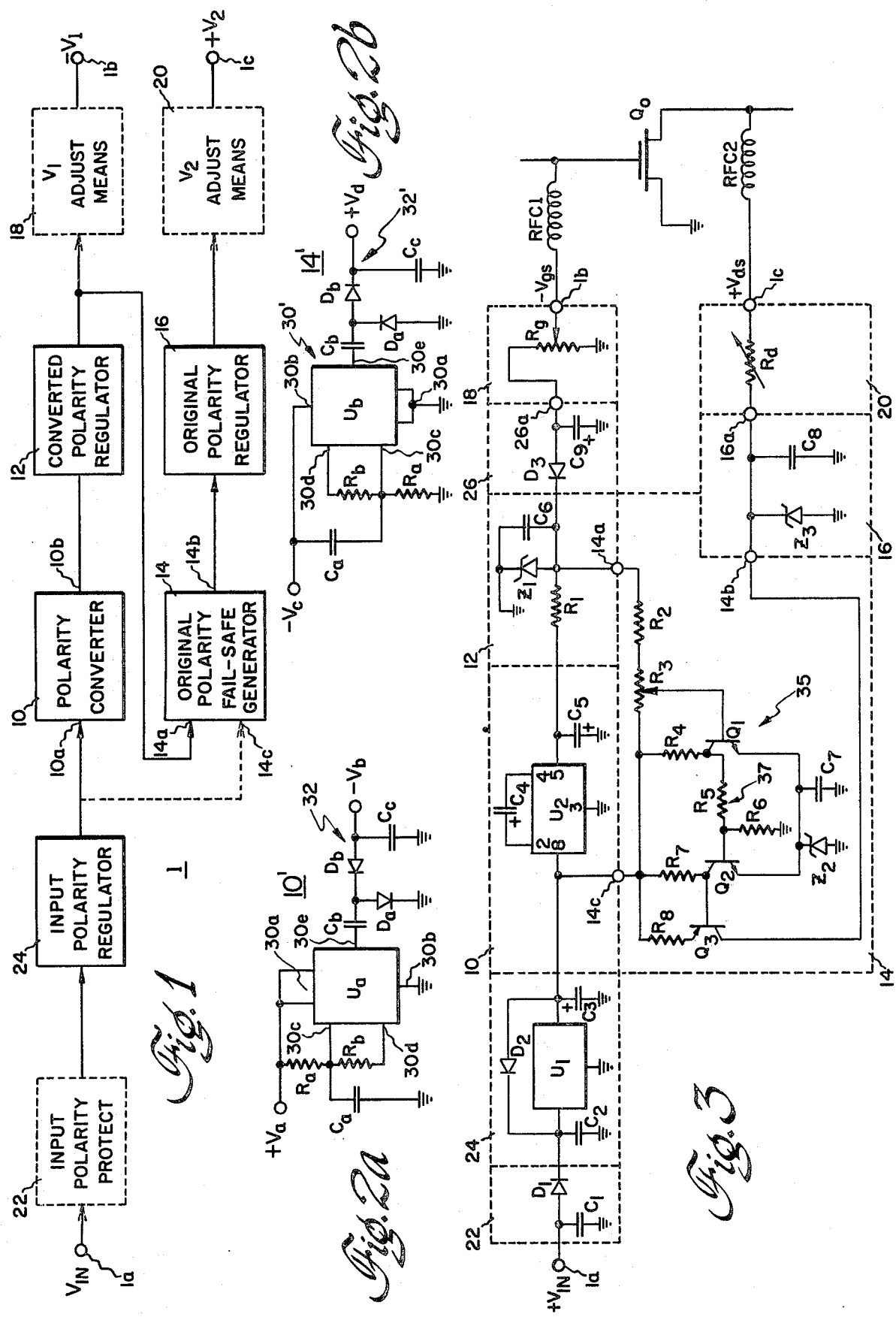

FAIL-SAFE AMPLIFIER POWER SUPPLY

BACKGROUND OF THE INVENTION

The present application concerns fail-safe power supplies and, more particularly, a novel fail-safe power supply for providing opposite-polarity potentials to a semiconductor device, such as a GaAsFET device in a microwave amplifier.

It is known that some semiconductor devices require potentials of opposite polarity for operation. Several of these devices may be severely damaged if one potential is applied without application of the other potential. In particular, it is known that low noise amplifiers in the VHF, UHF and microwave regions of the electromagnetic spectrum can be realized utilizing field-effect transistors fabricated of gallium-arsenide semiconductor material. Such devices are presently utilized in at least the initial stages of satellite and ground-station receivers, as well as in terrestial microwave link receivers, television tuners and the like. These GaAsFET devices require that a negative gate-source potential always be present whenever a positive drain-source potential (for a N-channel device) is present, to prevent destruction of the device.

The prior art has used operator-controlled manually-activated arrangements which apply the negative gate potential prior to application of positive drain potential, and remove positive drain potential prior to removal of negative gate potential. Several circuits are known which provide a short circuit for the drain electrode potential if the gate electrode potential is not applied prior to application of the drain potential, with the short circuit causing a circuit breaker or fusible element to subsequently provide an open circuit between the device drain electrode and the positive potential supply. These protect circuits generally require a relatively large number of active devices and all merely interface some form of sequential switching arrangement between the device and a pair of opposite polarity power supplies which are assumed to exist. Accordingly, it is highly desirable to provide apparatus which will not only provide the opposite-polarity potentials, but which will provide such potentials in a manner such that a controlled (drain) potential can not be applied to the device unless a first (gate) potential is present.

BRIEF SUMMARY OF THE INVENTION

In accordance with the invention, a fail-safe power supply for providing operating potential to each of a pair of electrodes, with respect to a common electrode, of an active device, such as a gallium-arsenide field-effect transistor, includes: means for providing a potential of a first polarity to one of the pair of electrodes; and means for providing another potential of the opposite polarity to the remaining electrode only if the first polarity potential is present. The another-potential-supplying circuitry is gated to provide a non-zero potential only if the first potential is of at least a minimum amplitude. Either or both of the opposite-polarity potentials may be regulated, with the second-potential gating signal being obtained after the first-potential regulator, if used.

In one presently preferred embodiment, a positive potential is supplied to a polarity inverter to produce a negative potential. The negative potential is regulated and applied via a slow-discharge circuit to the gate-potential-setting potentiometer of a GaAsFET amplifier. At least the regulated negative potential is applied to a fail-safe means for generating a potential of the original (positive) polarity. This subsequently-generated positive potential is also regulated and applied to the drain electrode of the GaAsFET amplifier device.

Accordingly, it is an object of the present invention to provide a novel fail-safe power supply for providing opposite-polarity operating potentials to a device requiring the presence of a first polarity potential at least while the remaining potential polarity is applied thereto.

This and other objects of the present invention will become apparent upon consideration of the following detailed description, when read in conjunction with the drawings.

BRIEF DESCRIPTION OF THE DRAWINGS

FIG. 1 is a block diagram of a fail-safe power supply in accordance with the principles of the present invention;

FIGS. 2a and 2b are polarity converter circuits for respectively converting positive and negative input potentials to respective negative and positive output potentials; and FIG. 3 is a schematic diagram of a presently preferred embodiment of the invention.

DETAILED DESCRIPTION OF THE INVENTION

Referring initially to FIG. 1, a fail-safe power supply 1 receives an input voltage $V_{IN}$ at an input 1a for providing a first potential, e.g. the negative voltage $-V_1$, at a first output 1b, and for providing another, opposite-polarity potential, e.g. the positive voltage $+V_2$, at a second output 1c, only if first potential $-V_1$ is present. The input potential $V_{IN}$, typically of a positive polarity, is coupled to the input 10a of a polarity converter means 10, providing a negative polarity voltage at the output 10b thereof. The converted-polarity potential is amplitude regulated by converted-polarity regulator means 12. The regulated converted-polarity potential is coupled to the $-V_1$ output 1b and to an input 14a of a fail-safe generator means 14 for providing a potential of the original (positive) polarity at the output 14b thereof. Generator 14 may also receive, at another input 14c, the original polarity potential, as coupled to polarity converter input 10a. However, the presence or absence of the original-polarity potential at output 14b is established only by the presence or absence of the converter-polarity voltage at the output of regulator means 12. Thus, potential is present at controlled output 1c only if the opposite polarity potential is present at output 1b; if the negative polarity potential at output 1b is not present, fail-safe generator 14 causes the output 1c potential to fall to a substantially zero magnitude. Accordingly, it is desirable both that generator input 14a be connected as closely as possible to output 1b, without substantial amplitude-shifting components therebetween, and also that the amplitude of the potential received at input 14a remain relatively constant, even if the exact potential amplitude at output 1b be made adjustable for purposes of optimizing the subsequent circuitry. Output 14b may be amplitude-regulated by an original-polarity potential regulator means 16, applying the regulated (positive) potential to the $+V_2$ output 1c. Where apparatus 1 provides operating potentials to a gallium-arsenide field-effect transistor amplifier, a gate-source voltage adjustment means 18 is often required between regulator 12 and the active device $Q_o$ gate electrode, to adjust the device gate-source potential (and therefore the device drain current) for optimum noise figure, gain or noise-figure/gain combination results. As it is desirable that generator output 14b fall to a substantially zero amplitude if the output of converter 10 and/or regulator 12 decrease by a preselected limit below nominal, the output potential of regulator 12, rather than the gate electrode potential, is connected to generator input 14a.

Apparatus 1 may optionally include means 20 for adjusting the magnitude of the $V_2$ voltage at output 1c, as may be required in GaAsFET amplifiers to adjust the magnitude of the drain-source potential applied to the device. For increased protection of apparatus 1, an input polarity protection means 22 may be utilized, to prevent possible destruction of any of means 12–20 due to the connection of a reverse polarity potential at input 1a. Advantageously, an input polarity regulator means 24 is utilized to regulate the voltages at polarity converter input 10a and fail-safe generator input 14c to a preselected value, somewhat less than the lowest expected amplitude of input voltage $V_{IN}$ and high enough to facilitate operation of converter 10 (and generator 14). Use of input regulator 24 is especially advantageous in situations where the input voltage may vary over a relativey large amplitude range.

Referring now to FIG. 2a, one embodiment of a polarity converter 10', for converting a positive input voltage of magnitude $+V_a$ to a negative polarity voltage of magnitude $-V_b$, utilizes an astable multivibrator 30, such as may be provided by a type 555 and the like integrated circuit timer $U_a$, and an output rectifier 32. In particular, for a type 555 integrated circuit timer, input potential $+V_a$ is connected between the normal $+V$ input 30a and the ground potential input 30b; the trigger and threshold inputs 30c of the integrated circuit are connected together to the junction between first and second timing resistances $R_a$ and $R_b$. A timing capacitance $C_a$ is connected to ground potential from the junction of resistances $R_a$ and $R_b$. The remaining terminal of resistance $R_a$ is connected to input potential $V_a$, while the remaining terminal of resistance $R_b$ is connected to the discharge output 30d of the integrated circuit. The output 30e of the integrated circuit is substantially a (square) waveform at a frequency determined by the values of resistances $R_a$ and $R_b$ and capacitance $C_a$. This output waveform is coupled to one terminal of the input capacitance $C_b$ of, illustratively, a voltage doubler. The remaining terminal of capacitance $C_b$ is coupled to the anode of a first multiplier diode $D_a$, having its cathode connected to ground potential. The anode of diode $D_a$ is coupled to a cathode of another diode $D_b$, having its anode connected both to the $-V_b$ output and to a filter capacitance $C_c$, having a remaining terminal connected to ground potential. Voltage doubler 32 rectifies and doubles the amplitude of the square wave at the astable multivibrator output 30e, providing a negative D.C. potential only if the input positive potential $+V_a$ is present.

Referring to FIG. 2b, one embodiment of a fail-safe generator 14' also utilizes an astable multivibrator 30' and an output rectifier means 32'. Multivibrator 30' may also utilize a type 555, and the like, timer integrated circuit, with the positive potential input 30a now coupled to ground potential and the ground input 30b now coupled to the negative input voltage $-V_c$. The remaining terminal of timing resistance $R_a$ is coupled to ground potential and remaining terminal of timing capacitance $C_a$ is coupled to the negative input potential, in reverse of the multivibrator circuit 30 of FIG. 2a. The periodic waveform at output 30e is coupled to the rectifier means 32', also shown as a voltage doubler. The polarity of voltage-doubler diodes $D_a$ and $D_b$ are reversed, to provide a circuit output of positive polarity and amplitude $+V_d$, which output is present only if input voltage $-V_c$ is present. It should be understood that a non-multiplying rectifier, or a higher-order multiplier (triplers, quadruplers and the like) may be used for either of circuits 32 or 32'.

Referring now to FIG. 3, a presently preferred embodiment of the fail-safe power supply apparatus 1 utilizes an input polarity protection circuit 22, having a series-pass diode $D_1$ connected between the $+V_{IN}$ input terminal 1a and the input of an input-polarity regulator 24. An input transient-suppressing capacitance $C_1$ is coupled between input terminal 1a and ground potential. Input polarity regulator 24 utilizes an integrated circuit voltage regulator $U_1$, having its input and output respectively coupled to ground potential through an input filter capacitance $C_2$ and an output filter capacitance $C_3$, respectively. A reverse-protection diode $D_2$ is connected between output and input of regulator $U_1$. In one embodiment, integrated circuit $U_1$ is a type 78L05 and the like integrated circuit, for input voltages $V_{IN}$ of positive polarity and magnitude between 9 and 15 volts D.C. The output of regulator 24 is applied to the input (pin 8) of a polarity-converting circuit 10, using an integrated circuit $U_2$ which may be an Intersil type ICL7660 and the like. A charge-pump capacitance $C_4$ is connected between pins 2 and 4 of the integrated circuit, whereby a negative potential appears between the output (pin 5) and ground potential (pin 3), across an output filter capacitance $C_5$. The resulting negative potential is applied to converted-polarity regulator 12. Regulator 12 utilizes a zener diode $Z_1$, which might have a zener voltage of about 3.6 voltage. Potential is supplied to the zener diode via a series resistance $R_1$. A noise-suppression capacitance $C_6$ is in shunt with zener diode $Z_1$. The output of regulator 12 is applied to circuit 26, comprising $D_3$ (having a cathode receiving the regulator output potential and an anode coupled to an output terminal 26a) and a storage capacitance $C_9$, coupled between terminal 26a and ground potential; the purpose of circuit 26 will be explained hereinbelow. The potential at output terminal 26a is coupled across a potentiometer $R_g$ acting as the first voltage adjusting means 18; the movable contact thereof is connected to power supply output 1b, and provides the gate-source voltage $-V_{gs}$ applied to the gate electrode of the FET $Q_0$ (preferably through a radio-frequency-choke RFC1).

Fail-safe generator 14 includes a fixed resistance $R_2$ and a fail-safe trip-point-setting potentiometer $R_3$, in series connection between generator inputs 14a and 14c. A Schmitt trigger subcircuit 35 includes first and second transistor $Q_1$ and $Q_2$, having their emitter electrodes connected together to the anode of another zener diode $Z_2$. A noise-suppression capacitance $C_7$ is connected across zener diode $Z_2$. The collector electrodes of each of transistors $Q_1$ and $Q_2$ are connected to positive polarity input 14c, respectively via collector resistances $R_4$ and $R_7$. The collector of transistor $Q_1$ is connected through a voltage divider network 37, comprising resistances $R_5$ and $R_6$, to the base transistor $Q_2$. The base electrode of a PNP series-pass transistor $Q_3$ is connected to the collector of transistor $Q_2$. The emitter electrode of transistor $Q_3$ is connected through a current-setting resistance $R_8$ to positive polarity input 14c. The collector electrode of transistor $Q_3$ is connected to fail-safe generator output 14b. The zener voltage of diode $Z_2$ is less than the magnitude of the positive polarity voltage at input 14c. Potentiometer $R_3$ is set such that, with the zener voltage of diode $Z_1$ present at input 14a, transistor $Q_1$ is cut off and transistors $Q_2$ and $Q_3$ are saturated. Transistor $Q_3$ supplies current to a third zener diode $Z_3$, comprising original polarity regulator 16. A noise-suppression capacitance $C_8$ is in shunt with diode $C_3$. Accordingly, when the negative potential established by diode $Z_1$ is present at input 14a, a positive potential appears at regulator output 16a. The potential at output 16a is coupled through a rheostat $R_d$ to circuit second output 1c, and thence to the drain electrode of the protector device $Q_0$ (preferably though a radio-frequency-choke RFC 2). The drain-source voltage $+V_{ds}$ is set by the magnitude of resistance $R_d$ and the drain current (itself set by the magnitude of the gate-source voltage $-V_{gs}$).

If the voltage across the zener diode $Z_1$ decreases by a predetermined amount, the potential at the base electrode of transistor $Q_1$ increases by an amount sufficient to switch transistor $Q_1$ into saturation, whereby both of transistors $Q_2$ and $Q_3$ are switched to the cutoff condition. Current ceases to flow from the fail-safe generator output 14b and the second circuit output 1c voltage falls to zero. Dependent upon the value of the various resistances, the type of transistor utilized for transistor $Q_1$, and the zener voltage of diode $Z_2$, restoration of the zener diode $Z_1$ voltage at input 14a may either restore the positive drain potential at output 1c, or may, typically by proper choice of the value of resistance $R_1$, maintain the magnitude of voltage at output 1c at the substantially zero condition, necessitating removal and reapplication of potential at input 1a before drain potential at output 1c will reappear.

Circuit 26 is particularly useful with GaAsFET amplifiers, wherein a relatively small magnitude of current flows through first output terminal 1b. During normal operation, the voltage at circuit output 26a is of slightly less negative magnitude then the zener voltage of diode $Z_1$, by an amount equal to the forward-conducting voltage drop of diode $D_3$. As the $D_3$ voltage drop is substantially constant, adjustment of potentiometer $R_g$, at initial setting thereof, includes the $D_3$ voltage drop, and no effect upon normal D.C. voltage occurs at output 1b. During circuit turn-off, under either normal operation or due to a decrease of the voltage at the $D_3$ cathode, the previously-charged storage capacitance $C_9$ maintains a sufficiently negative voltage at output 1b to prevent destruction of the protected device $Q_0$, while the voltage at controlled output 1c, rapidly falls to zero. Typically, if a short circuit is deliberately placed between generator input 14a and ground potential, the potential at output 1c falls substantially to zero in under 10 milliseconds, while the potential at output 1b slowly decreases to zero magnitude in about one second, providing sufficient protection to the protected device. During circuit power-up, transistor $Q_3$ will not conduct until the voltage at input 14a is present, whereby the voltage at output 1c appears several milliseconds after the voltage at output 1b.

While the present invention has been described with respect to presently preferred embodiments thereof, many modifications and variations will become apparent to those skilled in the art. For example, the entire circuit of FIG. 3, with the exception of variable resistors $R_g$ and $R_d$, may be integrated in a semiconductor substrate, having only four leads ($V_{IN}$, ground, negative output 26a and fail-safe positive output 16a). It is my intention, therefore, to be limited only by the scope of the appending claims and not by the specific details of the embodiments described herein.

What is claimed is:

1. A power supply, comprising:
   input means for receiving a single power-supply-operating potential;
   first and second output terminals;
   first means coupled to said input means for providing a first D.C. potential of a predetermined magnitude and polarity to said first output terminal; and
   fail-safe means for providing a second D.C. potential of predetermined magnitude and polarity to said second output terminal only if said first means is operational and said first potential is present at said first output terminal.

2. The power supply of claim 1, wherein said fail-safe means includes means, having an input and an output, for providing a periodic waveform at said output only if said first potential is present at said input; and rectifier means for converting said periodic waveform to said second D.C. potential.

3. The power supply of claim 2, wherein said periodic waveform providing means includes an astable multivibrator.

4. The power supply of claims 2 or 3, wherein said rectifer means is configured as a voltage multiplier.

5. The power supply of claim 1, wherein the potential at said input means is of a first polarity, the polarity of said second potential is said first polarity and is opposite to the polarity of said first potential.

6. The power supply of claim 1, further comprising means receiving the first potential output of said first means for regulating the magnitude thereof to a value less than said first means output magnitude, said regulated first potential being provided to said first output terminal.

7. The power supply of claim 6, wherein said power supply is utilized to provide operating potentials to a subsequent circuit, and further comprising means receiving the first output terminal potential for varying the magnitude of the first output potential applied to said subsequent circuit.

8. The power supply of claims 6 or 7, further comprising means coupled between said first potential regulating means and said first output terminal for maintaining the first output potential at said first output terminal for a predetermined time interval after the output of said fail-safe means is terminated.

9. The power supply of claim 1, further comprising means receiving the second potential output of said fail-safe means for regulating the magnitude thereof to a value less than said fail-safe means output magnitude, said regulated second potential being provided to said second output terminal.

10. The power supply of claim 9, wherein said power supply is utilized to provide operating potentials to a subsequent circuit, and further comprising means receiving the second output terminal potential for varying the magnitude of the second output potential applied to said subsequent circuit.

11. The power supply of claim 1, further comprising means for preventing application of an input potential of reverse polarity to at least said first means.

12. The power supply of claim 11, further comprising means coupled only between said reverse polarity preventing means and said first means for regulating the magnitude of the input potential prior to application thereof to said first means.

13. The power supply of claim 1, wherein said failsafe means includes a Schmitt trigger circuit having an input and an output; a series-pass transistor having a controller electrode connected to said Schmitt trigger output, an input electrode, and an output electrode coupled to said second output terminal; a current-setting resistance coupling between said series-pass device input electrode and said input potential; and a potential-divider means coupled between said input potential and said first output potential for establishing the voltage at said Schmitt trigger output to cause said series-pass transistor to conduct only if said first output terminal potential is at least a preselected percentage of said first potential predetermined magnitude, said series-pass transistor being substantially nonconducting if said first output terminal potential is less than said preselected percentage of said first potential predetermined magnitude.

* * * * *